(12) United States Patent
Champion et al.

(10) Patent No.: US 7,184,388 B2
(45) Date of Patent: Feb. 27, 2007

(54) HEATING ELEMENTS FOR A STORAGE DEVICE

(75) Inventors: Corbin L. Champion, Pullman, WA (US); Sarah M. Brandenberger, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 576 days.

(21) Appl. No.: 10/796,606

(22) Filed: Mar. 9, 2004

(65) Prior Publication Data
US 2005/0201255 A1    Sep. 15, 2005

(51) Int. Cl.
*G11B 7/00*    (2006.01)
(52) U.S. Cl. .................................................. 369/126
(58) Field of Classification Search ............. 369/44.12, 369/100, 126, 275.3
See application file for complete search history.

(56) References Cited

U.S. PATENT DOCUMENTS

| | | | |
|---|---|---|---|
| 5,345,815 A | 9/1994 | Albrecht et al. | |
| 5,835,477 A | 11/1998 | Binnig et al. | |
| 5,856,967 A | 1/1999 | Mamin et al. | |
| 6,233,206 B1 | 5/2001 | Hamann et al. | |
| 6,370,107 B1 | 4/2002 | Hosaka et al. | |
| 6,473,361 B1 | 10/2002 | Chen et al. | |
| 7,102,983 B2 * | 9/2006 | Gibson ....................... 369/126 | |

OTHER PUBLICATIONS

Vettiger and Binnig, Scientific American, "The Nanodrive Project," pp. 47-51, 53 (Jan. 2003).

* cited by examiner

*Primary Examiner*—Nabil Hindi

(57) ABSTRACT

A storage device includes a probe, and a substrate comprising a storage medium and heating elements. The heating elements area adapted to heat respective regions of the storage medium to form perturbations in the respective regions of the storage medium, and the probe is adapted to detect the perturbations.

35 Claims, 4 Drawing Sheets

HEATING ELEMENTS FOR A STORAGE DEVICE

BACKGROUND

In computing systems, such as desktop computers, portable computers, personal digital assistants (PDAs), servers, and others, storage devices are used to store data and program instructions. One type of storage device is a disk-based device, such as a magnetic disk drive (e.g., a floppy disk drive or hard disk drive) and an optical disk drive (e.g., a CD or DVD drive). Disk-based storage devices have a rotating storage medium with a relatively large storage capacity. However, disk-based storage devices offer relatively slow read-write speeds when compared to operating speeds of other components of a computing system, such as microprocessors and other semiconductor devices.

Another type of storage device is a solid state memory device, such as a dynamic random access memory (DRAM), static random access memory (SRAM), flash memory, and electrically erasable and programmable read-only memory (EEPROM). Although solid state memory devices offer relatively high read-write speeds, usually on the order of nanoseconds, they have relatively limited storage capacities.

With improvements in nanotechnology (technology involving microscopic moving parts), other types of storage devices are being developed. One such storage device is based on atomic force microscopy (AFM), in which one or more microscopic scanning probes are used to read and write to a storage medium. Typically, a scanning probe has a tip that is contacted to a surface of the storage medium. Storage of data in the storage medium is based on perturbations created by the tip of the probe in the surface of the storage medium. In one implementation, a perturbation is a dent in the storage medium surface, with a dent representing a logical "1," and the lack of a dent representing a logical "0." Other types of perturbations that can be created in the surface of the storage medium include creating or altering the topographic features or composition of the storage medium, altering the crystalline phase of the medium, filling or emptying existing electronic states of the medium, creating or altering domain structures or polarization states in the medium, creating or altering chemical bonds in the medium, employing the tunneling effects to move and remove atoms or charge to or from the medium, or storing/removing charge from a particular region.

Conventionally, for writing or erasing a storage cell of a probe-based storage device, the tip of a probe in the storage device is heated to an elevated temperature to enable formation of dent (during a write operation) or removal of a dent (during an erase operation). One technique of heating the probe is to pass an electrical current through a cantilever of the probe to a resistive element at the end of the probe. The electrical current passing through the resistive element causes heating of the probe tip. To perform this type of local heating, a conductor with the ability to pass a relatively high electrical current has to be provided in the probe cantilever, which may add to manufacturing complexity and result in lower manufacturing yield of probe-based storage devices.

DETAILED DESCRIPTION

Figure 1:
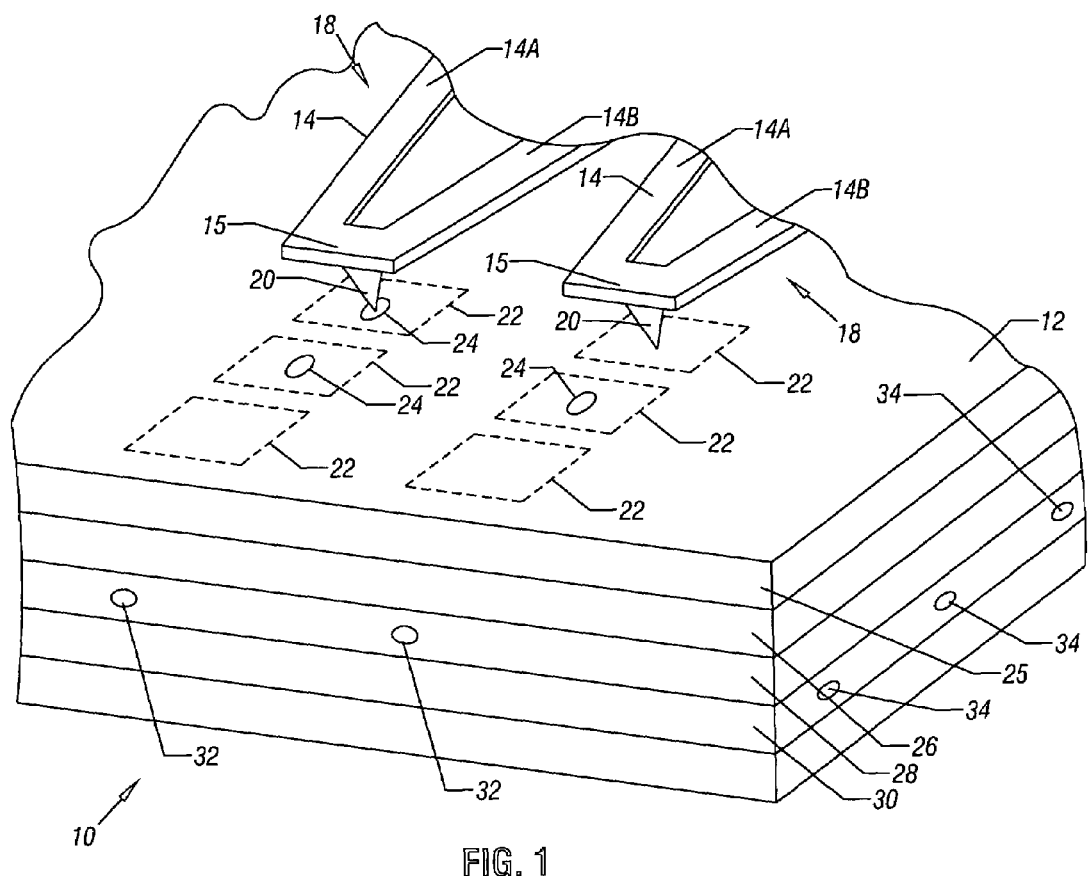
FIG. 1 illustrates a portion of a probe-based storage device that includes a storage substrate defining a storage medium and having heating elements to enable the writing and/or erasing of storage cells in the storage medium, in accordance with some embodiments of the invention.

FIG. 1 shows an example probe-based storage device that includes a storage substrate 10 that provides a storage medium. As used here, the term "storage medium" refers to any medium in which storage cells are capable of being formed. In FIG. 1, the storage medium is made up of a layer 25 of the storage substrate 10.

The layer 25 has a storage surface 12 on which perturbations can be formed by tips 20 of respective probes 18 (two shown in FIG. 1). The tip 20 of each probe 18 is attached to and extends outwardly from a cantilever 14 of the probe 18. According to some embodiments, each probe 18 is a very small probe (on the order of micrometers, nanometers, or even smaller) that is built using nanotechnology techniques. Such a probe is referred to as a microscopic probe or a nanotechnology probe.

In the implementation depicted in FIG. 1, the cantilever 14 of each probe 18 has two sections 14A and 14B that join at an end portion 15. The tip 20 protrudes from the end portion 15 of the cantilever 14. In alternative embodiments, instead of having plural sections 14A, 14B, the cantilever 14 can be a single-piece cantilever.

The layer 25 (that makes up the storage medium) of the storage substrate 10 is formed of a relatively soft material to enable the formation of dents 24 in the layer 25. In some implementations, the layer 25 is formed of a polymer such as polymethylmethacrylate (PMMA). The dents 24 are formed in respective storage cells 22. Each dent 24 is basically a pit or hole that is formed into the layer 25. FIG. 1 shows an array six of storage cells 22, with three of the storage cells 22 including dents 24 and three of the storage cells 22 not including dents. Note that a large number of storage cells can be provided by the storage substrate 10, with six of such storage cells 22 shown in FIG. 1 for purposes of illustration. One of the probes 18 depicted in FIG. 1 is provided to write to or read from a first column of storage cells 22, while the other one of the probes 18 depicted in FIG. 1 is provided to write to or read from storage cells 22 in a second column. Absence of a dent 24 represents a first storage state (e.g., logical "0"), while presence of the dent 24 represents a second storage state (e.g., logical "1"). The dents 24 are formed during a write operation. To detect states of storage cells 22, the tip 20 of each probe 18 is scanned across selected storage cells 22 to determine whether or not a dent 24 is present in each of the storage cells.

After dents are formed, another operation that can be performed is an erase operation, in which dents 24 formed in respective storage cells 22 can be erased. Erasing of storage cells can be performed on an individual basis (that is, a selected one of the storage cells is erased) or on a group basis (a group of storage cells is erased at the same time). Another alternative is to erase all storage cells of the storage device at the same time. An erase operation that erases more than one storage cell at one time is referred to as a block erase.

The storage device shown in FIG. 1 also includes additional layers below the layer 25 that makes up the storage medium. A layer 26 below the layer 25 contains heating elements for heating respective regions of the layer 25 (corresponding to the storage cells 22) for purposes of writing to or erasing the storage cells 22. According to one embodiment, the heating elements are resistive elements that are heated when electrical current is provided through such resistive elements. The heating of each resistive element causes a corresponding region of the layer 25 (corresponding to a storage cell 22) to be heated to an elevated temperature (e.g., up to 400° or greater) such that melting of the layer in the region occurs. The specific temperature at which melting occurs depends upon the material selected from the layer 25.

When melting of a region of the layer 25 occurs, the tip 20 of a probe 18 writes to the storage cell 24 by applying a force onto the storage surface 12 of the melted region of the layer 25. The force applied by the probe tip 20 imprints the dent 24 into the layer 25. The applied force can be an incremental, applied force, or alternatively, a constant force due to the elastic nature of the cantilever 14. For example, the storage device can be assembled such that the cantilever 14 of each probe 18 is bent back a little and thus applies constant force on the storage surface 12.

According to one embodiment, each storage cell 22 is associated with a respective individual resistive element. In an alternative embodiment, a group of storage cells 22 is associated with one resistive element such that heating by the one resistive element causes heating of regions of the layer 25 corresponding to the group of storage cells 22. In the latter case, each of plural resistive elements is associated with a respective group of multiple storage cells 22.

To activate selected resistive elements, an array of select lines 32 and 34 are used. The select lines 32 run in a first direction along the probe-based storage device in a layer 28 (below the layer 26), while the select lines 34 run across a second direction (that is generally perpendicular to the first direction) in another layer 30 of the storage substrate 10. The select lines 32 and 34 are implemented as electrical conductive traces routed through the different layers 28 and 30. Selection of a pair of a select line 32 and a select line 34 causes a respective resistive element to be activated such that electrical current passes through the selected resistive element.

By passing the electrical current used for heating the resistive elements through electrical conductive traces making up the select lines 32, 34 formed in layers of the substrate 10, such current (which can be relatively high) does not have to be passed through the cantilevers 14 of the probes 18, which may lead to manufacturing complexity and reduced manufacturing yield. Although the cantilevers 14 of the probes 18 may still have to pass electrical current for purposes of reading storage states of storage cells 22, such electrical currents associated with read operations are usually much lower than the electrical current used for heating resistive elements.

Figure 2:
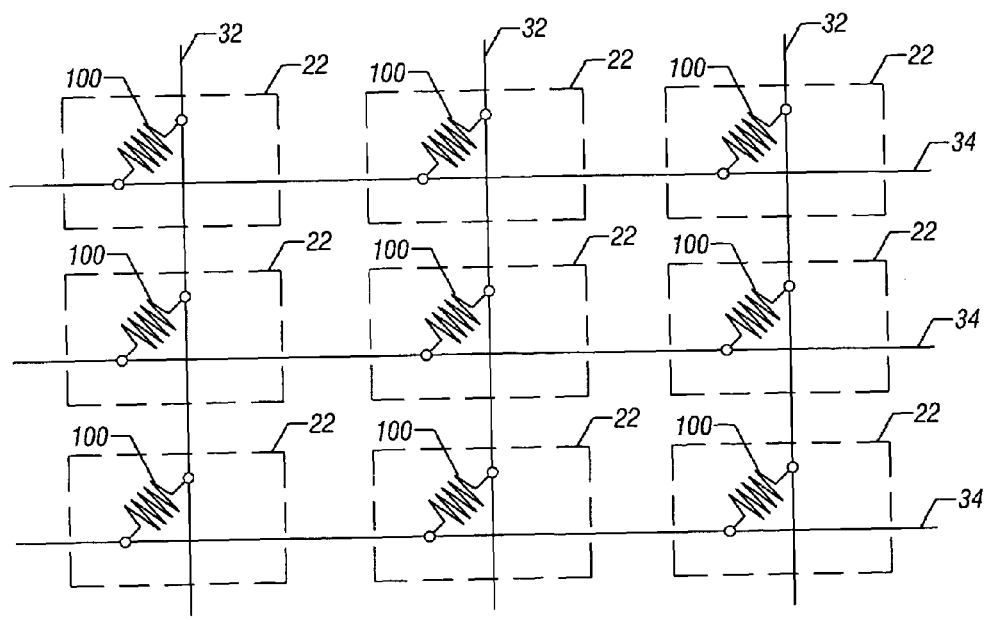
FIG. 2 is a schematic diagram of heating elements (formed of resistive elements) associated with respective storage cells in the storage medium of FIG. 1, in accordance with an embodiment.

A schematic representation of an array of resistive elements 100 is provided in FIG. 2. In the FIG. 2 implementation, each storage cell 22 is associated with an individual resistive element. One node of each resistive element 100 is connected to a select line 32 (the X select line), while the other node of each resistive element 100 is connected to the other select line 34 (the Y select line). Thus, if writing or erasing of a particular storage cell 22 is desired, one pair of an X select line and a Y select line is activated.

Figure 5:
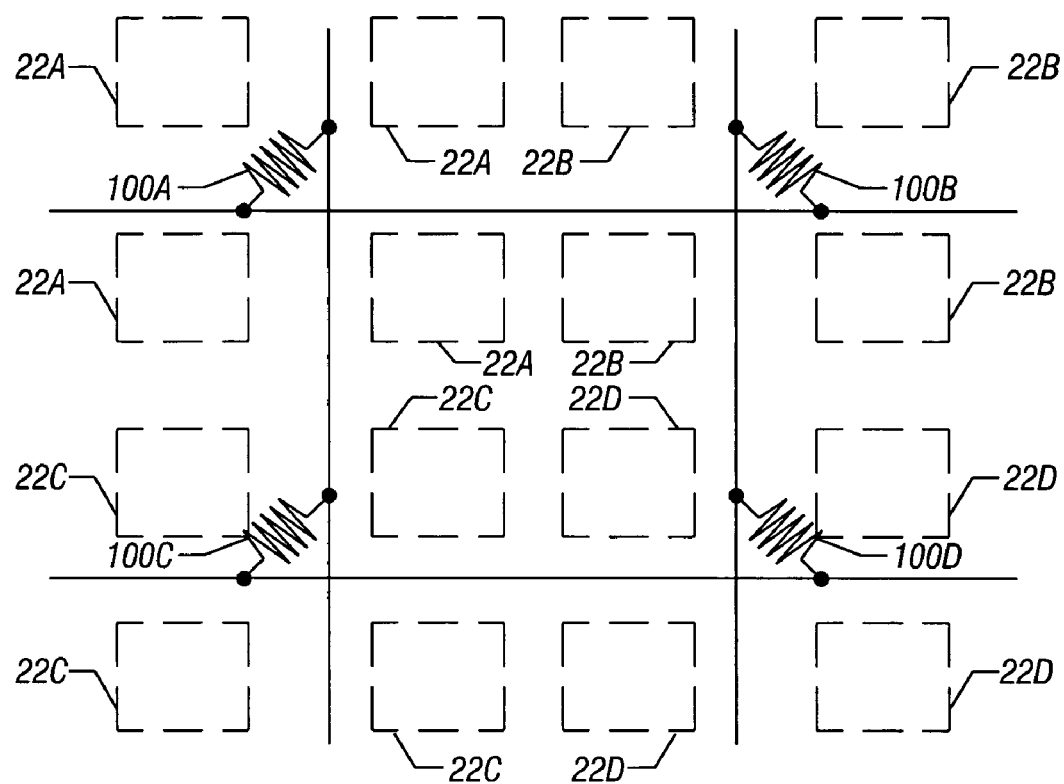
FIG. 5 is a schematic diagram of heating elements (formed of resistive elements) associated with respective groups of storage cells in the storage medium of FIG. 1, in accordance with another embodiment.

In a different implementation, as shown in FIG. 5, each of plural resistive elements 100A, 100B, 100C, 100D can be associated with a respective group of multiple storage cells 22A, 22B, 22C, 22D. The resistive element 100A is used to heat regions of the layer 25 (FIG. 1) corresponding to the storage cells 22A. Similarly, the resistive element 100B is activated to heat regions of the layer 25 (FIG. 1) corresponding to storage cells 22B, the resistive element 100C is activated to heat regions of the layer 25 corresponding to storage cells 22C, and the resistive element 100D is activated to heat regions of the layer 25 corresponding to storage cells 22D.

Figure 3:
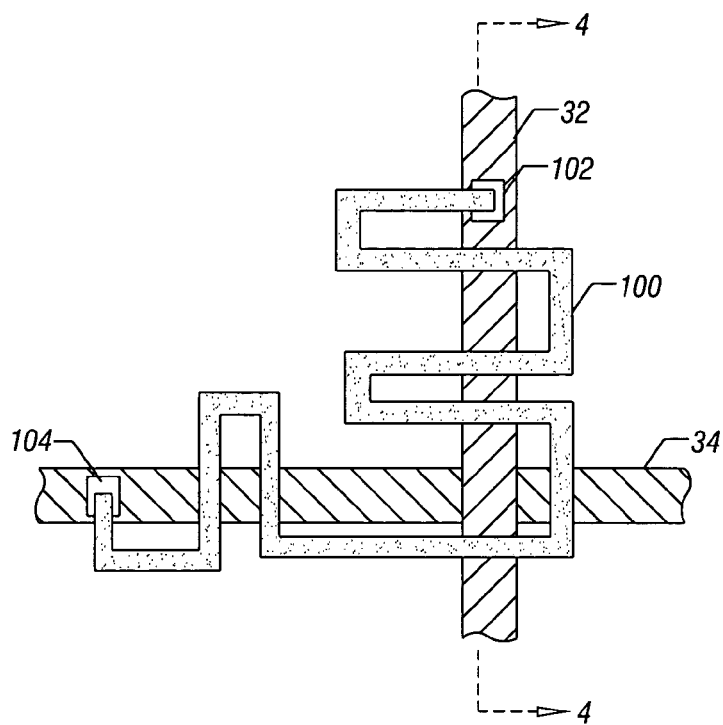
FIG. 3 illustrates a layout depicting a resistive element electrically connected to select lines in the probe-based storage device of FIG. 1, in accordance with an embodiment.

The layout of an example implementation of a resistive element 100 that is electrically connected to select lines 32 and 34 is shown in FIG. 3. The resistive element 100 is formed of a resistive trace that is arranged in a generally serpentine pattern to achieve a predetermined resistance value. The resistive trace making up the resistive element 100 can be formed of a semiconductor material (e.g., silicon, polysilicon, etc.) or other resistive material. The total resistance of the resistive trace making up the resistive element 100 is based on the length and width of the resistive trace. The resistance is increased with increased length or reduced width of the resistive trace. In other words, the resistance of the resistive trace is higher with a longer resistive trace. Also, the resistance of the resistive trace is higher with a narrower resistive trace.

One end of the resistive trace is electrically connected to the select line 32 by an electrical contact 102. The select line 32 is formed of an electrically conductive trace (e.g., a trace formed of a metal, polysilicon, or other electrically conductive material). The contact 102 is a via that electrically connects elements in different layers of the storage substrate 10. The other end of the resistive trace that makes up the resistive element 100 is electrically connected to the select line 34 by an electrical contact 104. The select line 34 is also a trace formed of an electrically conductive material.

Figure 4:
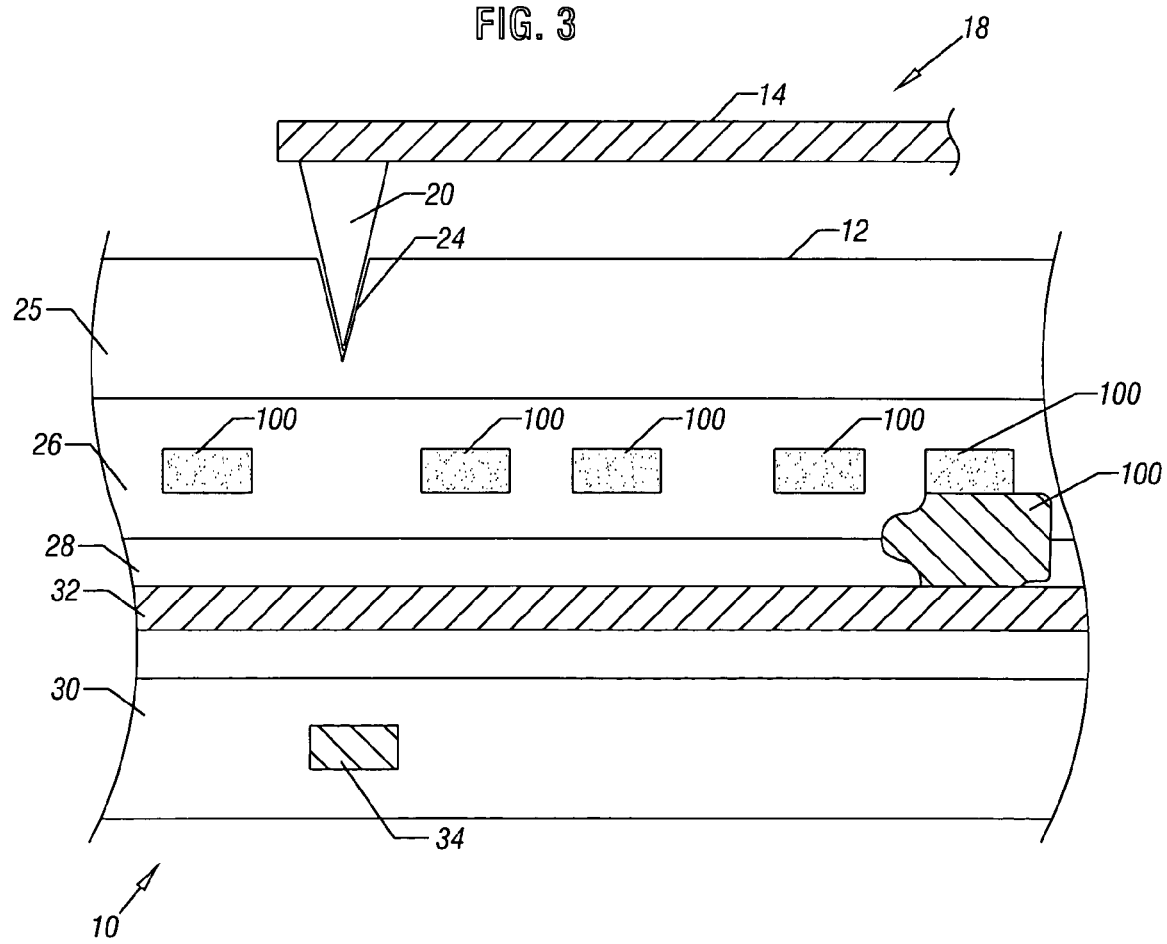
FIG. 4 is a cross-sectional view of the structure of FIG. 3 and a probe provided over the structure of FIG. 3.

FIG. 4 shows a cross-sectional view (taken along section line 4—4 of FIG. 3) of the structure of FIG. 3 along with a probe 18 that is engaged in a dent 24 formed in the layer 25. Activation of the resistive element 100 causes current to pass through the resistive element 100, which heats up a region of the layer 25 above the resistive element 100 to cause melting of the region of the layer 25. A downward force applied by the tip 20 forms the dent 24 into the melted region of the layer 25.

During an erase operation, the probe 18 does not actually have to be engaged with the layer 25. During an erase operation, the resistive element 100 is activated such that melting of the region of the layer 25 in the proximity of the resistive element 100 occurs. When melted, the material that makes up the layer 25 reflows back into the dent 24, which causes the dent 24 to be erased.

In an alternative embodiment, instead of forming dents 24 in respective storage cells 22 to represent a data state, other types of perturbations can be formed in the storage cells 22. For example, the heating of regions of the layer 25 corresponding to the storage cells 22 can affect the molecular structure of a region of the layer 25. In this alternative embodiment, to program a first storage state into a storage cell 22, the corresponding region of the layer 25 is heated and allowed to cool at a relatively rapid rate (a "first rate"), which causes the structure of the region of the layer 25 to be amorphous. On the other hand, to program a second storage state into the storage cell 22, the corresponding region of the layer 25 is heated and allowed to cool more gradually (at a second rate that is less than the first rate). This allows the region of the layer 25 in the proximity of the resistive element to have a more crystalline structure. One example material with a molecular structure that can be controlled by the cooling rate following heating is indium salinide. Effectively, the rate at which a heated region of the layer 25 is cooled after deactivation determines the crystallinity of the selected region of the layer 25.

The rate of cooling can be controlled by the rate of deactivation of a resistive element. For fast cooling, the resistive element can be switched off such that no current flows through the resistive element. For more gradual cooling, the amount of current passing through the resistive element can be gradually decreased (such as by gradually reducing a voltage different between the select lines 32 and 34).

An amorphous structure is more resistive than a crystalline structure. Thus, to read from a storage cell 22, an electrical current is applied through the probe 18 and the tip 20 to the region of the layer 25 corresponding to the storage cell 22. The resistance of the region of the layer 25 can be measured to detect whether the storage cell 22 is storing a first storage state (corresponding to an amorphous structure of the region of the layer 25) or the second storage state (corresponding to the region of the layer 25 having a crystalline structure). In this alternative embodiment, the perturbation formed in the storage cell can be considered a state of the corresponding region of the layer 25 having a crystalline structure, whereas lack of a perturbation in the storage cell is considered a state of the corresponding region of the layer 25 with an amorphous structure.

Another alternative embodiment involves heating of a region of the layer 25 corresponding to a storage cell such that a bump is formed above the storage surface 12 of the layer 25. Such a bump can be caused by rapid heating of the region of the layer 25. Thus, to store data according to a first storage state in a storage cell 22, the corresponding region of the layer 25 is heated rapidly by the resistive element such that a bump is formed above the storage surface 12. To store data having a different storage state, the bump is not formed in the corresponding region of the layer 25. In this embodiment, the bump is considered the perturbation.

Reading of the storage state of each storage cell 22 in this embodiment is accomplished by scanning the tip 20 of the probe 18 across the storage surface 12 of the storage substrate 10. If the tip 20 encounters a bump in a storage cell 22, then that indicates a first storage state. If no bump is encountered in a storage cell 22, then a second storage state is indicated.

Detection of a bump can be accomplished by measuring deflection of the probe 18. For example, a piezoresistive element can be provided on the probe 18 such that deflection of the probe 18 causes the resistance of the piezoresistive element to change. The change in the resistance of the piezoresistive element enables circuitry to detect for the state of the storage cell 22.

Figure 6:
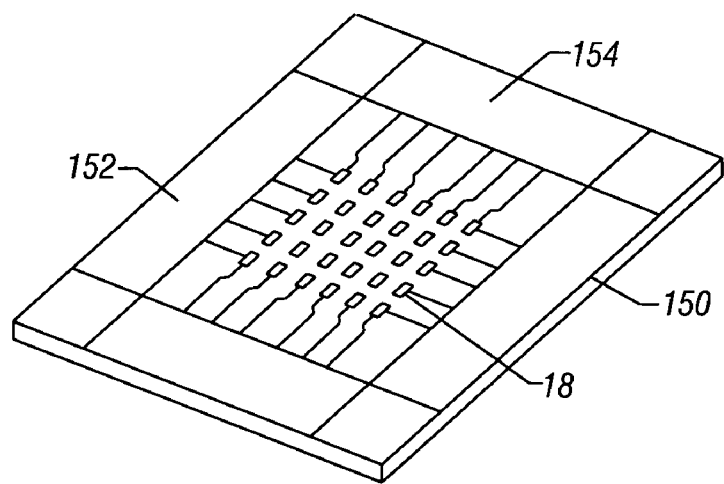
FIG. 6 is a schematic diagram of a probe substrate containing an array of probes and peripheral circuitry to interact with such probes in the probe-based storage device of FIG. 1.

FIG. 6 illustrates a probe substrate 150 that includes an array of probes 18 formed in the probe substrate 150. Peripheral circuitry 152 and 154 are provided on the peripheral sides of the probe substrate 150. For example, peripheral circuitry 152 and 154 can drive select lines (including select lines 32 and 34 shown in FIG. 2) to select bits of the storage array to read from, write to, or erase. A row of probes 18 may be activated by the select lines to read from or write to storage cells that the probes are in contact with. This structure enables concurrent access of multiple cells in one operation, which improves access speeds. Alternatively, one of the probes may be activated to read from or write to a storage cell. The peripheral circuitry 152 and 154 also include sensing devices and decoders to detect analog signals from the probes during a read operation. The sensing devices and decoders convert the analog signals to a digital representation of a logical "0" or a logical "1."

Figure 7:
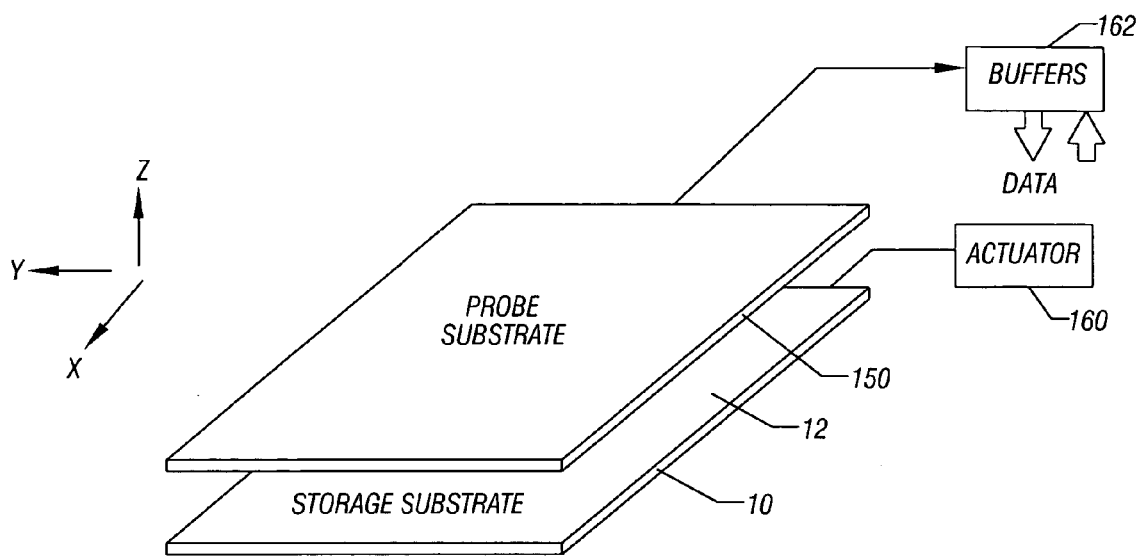
FIG. 7 illustrates the probe substrate positioned to face the storage substrate in the probe-based storage device of FIG. 1.

As shown in FIGS. 1 and 7, the probe substrate 150 is placed with the surface containing the probes 18 facing the storage surface 12 of the storage substrate 10, on which the storage cells are formed. The probe substrate 150 is positioned over the storage substrate 10 so that the probe tips 20 (FIG. 1) point downwardly to engage the storage surface 12 of the storage substrate 10. In an alternative arrangement, the storage substrate 10 is positioned over the probe substrate 150 so that the probe tips 20 point upwardly to face the storage surface 12. In other arrangements, the probe substrate 150 and the storage substrate 10 can have a lateral or diagonal relationship.

The storage substrate 10, in the example of FIG. 7, is coupled to an actuator 160 that is designed to move the storage substrate 10 in both X and Y directions such that probes 18 (FIG. 1) can be placed over desired storage cells on the storage substrate 10. Data sensed by the probes 18 is provided to buffers 162, which store output data for retrieval by an external device. The buffers 162 may also store write data to be written to storage cells 22 (FIG. 1) in the storage substrate 10.

Alternatively, the actuator 160 is operatively coupled to move the probe substrate 150, or to move both the probe substrate 150 and the storage substrate 10. The actuator 160 is also able to move the probe substrate 150 and/or the storage substrate 10 in the Z direction, which is generally perpendicular to the X and Y directions.

Figure 8:
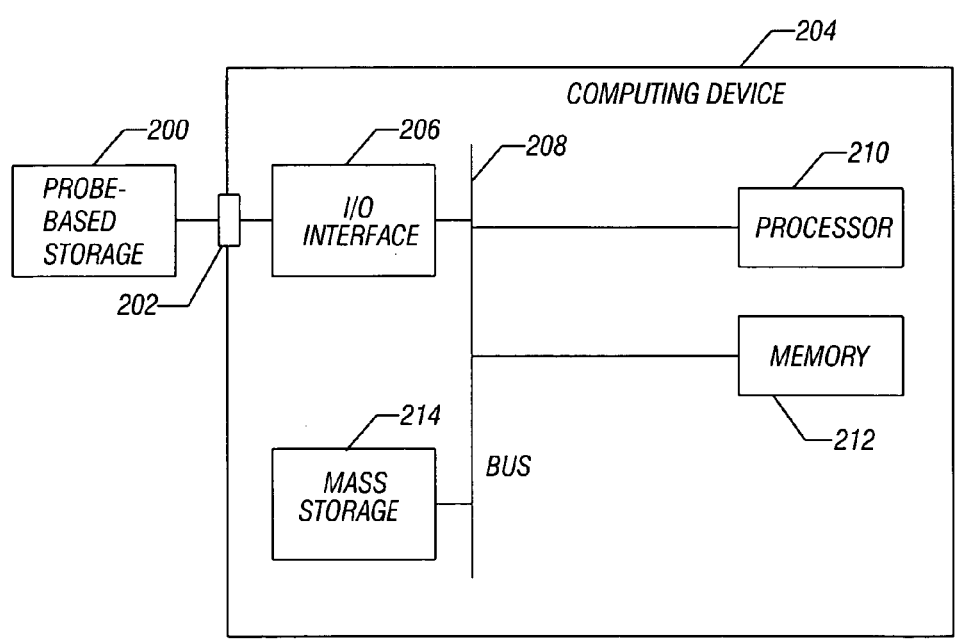
FIG. 8 is a block diagram of a system that includes a computing device having a port to connect to a probe-based storage device incorporating an embodiment of the invention.

The probe-based storage device according to some embodiments can be packaged for use in a computing system. For example, as shown in FIG. 8, a probe-based storage device 200 that incorporates the heating elements discussed above is attached or connected to an I/O (input/output) port 202 of a computing device 204. The I/O port 202 can be a USB port, a parallel port, or any other type of I/O port. Inside the computing device 204, the I/O port 202 is connected to an I/O interface 206, which in turn is coupled to a bus 208. The bus 208 is coupled to a processor 210 and memory 212, as well as to mass storage 214. Other components may be included in the computing device 204. The arrangement of the computing device 204 is provided as an example, and is not intended to limit the scope of the invention. In alternative embodiments, instead of being coupled to an I/O port of the computing system, the probe-based storage device can be mounted (directly or through a socket) onto the main circuit board of the computing system.

In the foregoing description, numerous details are set forth to provide an understanding of the present invention.

However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A storage device comprising:
   a probe; and
   a substrate comprising a storage medium and heating elements,
   the heating elements adapted to heat respective regions of the storage medium to form perturbations in the respective regions of the storage medium,
   the probe adapted to detect the perturbations.

2. The storage device of claim 1, wherein the perturbations comprise dents, and wherein the probe is adapted to form dents during write operations in regions of the storage medium that have been heated by respective heating elements.

3. The storage device of claim 2, wherein the storage medium has plural storage cells made up of the respective regions of the storage medium, the heating elements being associated with respective storage cells.

4. The storage device of claim 3, further comprising select lines to select one or more of the heating elements,
   the select lines to activate at least one of the heating elements to heat a region of the storage medium corresponding to one of the storage cells to perform one of writing and erasing.

5. The storage device of claim 4, wherein the select lines are provided in the substrate.

6. The storage device of claim 5, wherein the substrate further comprises a first layer containing a first set of select lines, and a second layer containing a second set of select lines.

7. The storage device of claim 3, wherein the heating elements are adapted to heat respective storage cells to erase data stored by the storage cells.

8. The storage device of claim 1, wherein the substrate comprises a layer making up the storage medium, the layer between the probe and the heating elements.

9. The storage device of claim 8, wherein the layer is formed of a material containing polymer.

10. The storage device of claim 8, wherein a selected one of the heating elements is adapted to melt a region of the layer to enable the probe to form a dent in the melted region.

11. The storage device of claim 1, wherein the heating elements comprise resistive elements.

12. The storage device of claim 1, wherein the storage medium has plural storage cells made up of respective regions of the storage medium, wherein each of the heating elements is adapted to heat a respective group of plural storage cells.

13. The storage device of claim 1, wherein the heating elements are adapted to deactivate to cool the respective regions of the storage medium, wherein a rate of cooling of the respective regions of the storage medium affects the crystallinity of the respective regions.

14. The storage device of claim 13, wherein deactivation of a first heating element to cool a first region of the storage medium at a first rate causes the first region to have an amorphous structure, and wherein deactivation of a second heating element to cool a second region of the storage medium at a second, slower rate causes the second region to have a crystalline structure.

15. The storage device of claim 14, wherein the probe is adapted to detect the amorphous structure of the first region and the crystalline structure of the second region based on detected resistances associated with the first and second regions, wherein the crystalline structure has a lower resistance then the amorphous structure.

16. The storage device of claim 1, wherein the perturbations comprise bumps formed above a surface of the storage medium, the bumps caused by heating of respective heating elements.

17. A system comprising:
   a processor; and
   a storage device comprising:
      a probe, and
      a substrate comprising a storage medium and heating elements, the storage medium having plural storage cells,
      the heating elements adapted to heat respective storage cells for programming the storage cells,
      the probe adapted to read storage cells.

18. The system of claim 17, wherein the probe is adapted to be scanned across a surface of the storage medium to read the storage cells.

19. The system of claim 18, wherein the storage device further comprises an actuator to move the substrate to cause scanning of the probe across the surface of the storage medium.

20. The system of claim 19, further comprising a probe substrate on which the probe is formed, the probe substrate further comprising additional probes to read the storage cells.

21. The system of claim 17, wherein heating by the heating elements causes perturbations to be formed in storage cells that are heated,
   wherein the probe is adapted to detect the perturbations to determine a data state.

22. The system of claim 21, wherein the probe is adapted to form a dent in a storage cell that has been heated by a corresponding heating element.

23. The system of claim 22, wherein the heating element is adapted to melt a region of the storage medium corresponding to a storage cell to enable the probe to imprint a dent into the melted region.

24. The system of claim 17, wherein the heating elements comprise resistive elements.

25. The system of claim 24, wherein the storage device further comprises select lines to activate the resistive elements, and
   peripheral circuitry to activate the select lines.

26. The system of claim 25, further wherein the select lines comprise electrically conductive traces in the substrate.

27. The system of claim 17, wherein the probe has a tip to interact with a heated region of the storage medium to form a respective perturbation during a write operation.

28. The system of claim 17, wherein the heating elements are adapted to heat respective storage cells to erase the storage cells.

29. The system of claim 19, wherein the probe comprises a nanotechnology probe.

30. A method of storing data in a storage device, comprising:
   activating heating elements provided in a substrate to heat respective regions of a storage medium that is formed in the substrate;

forming perturbations in regions of the storage medium by heating the selected regions with respective heating elements; and detecting the perturbations with a probe.

31. The method of claim 30, wherein activating the heating elements comprises activating resistive elements.

32. The method of claim 31, wherein activating the resistive elements comprises causing electrical current to conduct through the resistive elements.

33. The method of claim 29, wherein forming the perturbations comprises forming dents.

34. The method of claim 29, wherein forming the perturbations comprises forming bumps.

35. The method of claim 30, wherein forming the perturbations comprises forming at least one of an amorphous structure and a crystalline structure in a selected region of the storage medium.

* * * * *

UNITED STATES PATENT AND TRADEMARK OFFICE
CERTIFICATE OF CORRECTION

PATENT NO. : 7,184,388 B2 Page 1 of 1
APPLICATION NO. : 10/796606
DATED : February 27, 2007
INVENTOR(S) : Corbin L. Champion et al.

It is certified that error appears in the above-identified patent and that said Letters Patent is hereby corrected as shown below:

In column 8, line 9, in Claim 15, delete "then" and insert -- than --, therefor.

In column 10, line 1, in Claim 33, delete "claim 29" and insert -- claim 30 --, therefor.

In column 10, line 3, in Claim 34, delete "claim 29" and insert -- claim 30 -- , therefor.

Signed and Sealed this

Sixteenth Day of March, 2010

David J. Kappos
*Director of the United States Patent and Trademark Office*